(12) United States Patent
Hirao et al.

(10) Patent No.: US 7,754,105 B2
(45) Date of Patent: Jul. 13, 2010

(54) WATER-SOLUBLE PREFLUX AND USAGE OF THE SAME

(75) Inventors: Hirohiko Hirao, Kagawa (JP);
Yoshimasa Kikukawa, Kagawa (JP);
Takayuki Murai, Kagawa (JP)

(73) Assignee: Shikoku Chemicals Corporation, Kagawa (JP)

( * ) Notice: Subject to any disclaimer, the term of this patent is extended or adjusted under 35 U.S.C. 154(b) by 358 days.

(21) Appl. No.: 11/914,138

(22) PCT Filed: May 23, 2006

(86) PCT No.: PCT/JP2006/310271

§ 371 (c)(1),
(2), (4) Date: Dec. 5, 2007

(87) PCT Pub. No.: WO2006/126551

PCT Pub. Date: Nov. 30, 2006

(65) Prior Publication Data

US 2008/0318070 A1    Dec. 25, 2008

(30) Foreign Application Priority Data

May 24, 2005  (JP) ............... 2005-150279
Dec. 9, 2005  (JP) ............... 2005-355985

(51) Int. Cl.
| | |
|---|---|
| C23F 11/10 | (2006.01) |
| C23F 11/12 | (2006.01) |
| C23F 11/14 | (2006.01) |
| B23K 35/362 | (2006.01) |
| B23K 1/20 | (2006.01) |
| B23K 5/213 | (2006.01) |
| B23K 20/24 | (2006.01) |
| B23K 31/02 | (2006.01) |
| B05D 5/12 | (2006.01) |
| B23B 15/04 | (2006.01) |

(52) U.S. Cl. .............. 252/390; 252/401; 148/23; 148/516; 228/203; 228/206; 228/207; 427/96.2; 427/96.4; 427/96.6; 427/310; 427/318; 428/457

(58) Field of Classification Search ............ 148/23, 148/516; 228/203; 427/96.2; 252/390, 401
See application file for complete search history.

(56) References Cited

U.S. PATENT DOCUMENTS

| | | | | |
|---|---|---|---|---|
| 3,801,573 | A | * | 4/1974 | Cohen ............ 544/6 |
| 4,631,139 | A | * | 12/1986 | Burton et al. ........ 508/285 |
| 5,985,043 | A | | 11/1999 | Zhou et al. |
| 6,197,774 | B1 | * | 3/2001 | Yamada et al. ...... 514/259.3 |
| 6,660,943 | B1 | | 12/2003 | Gotoh et al. |
| 2002/0089067 | A1 | | 7/2002 | Crane et al. |
| 2005/0218195 | A1 | | 10/2005 | Wilson et al. |
| 2007/0246134 | A1 | * | 10/2007 | Hirao et al. ......... 148/528 |

FOREIGN PATENT DOCUMENTS

| | | |
|---|---|---|
| JP | 46-17046 B | 5/1971 |
| JP | 4-206681 A | 7/1992 |
| JP | 5-25407 A | 2/1993 |
| JP | 5-186888 A | 7/1993 |
| JP | 9-176524 A | 7/1997 |
| JP | 2005-68530 A | 3/2005 |
| JP | 2005-226082 A | 8/2005 |
| JP | 2005-349439 A | 12/2005 |
| WO | 03/020816 A1 | 3/2003 |

OTHER PUBLICATIONS

Extended European Search Report in counterpart European Application No. 06746755.5, mailed Mar. 29, 2010.

* cited by examiner

*Primary Examiner*—Joseph D Anthony
(74) *Attorney, Agent, or Firm*—Sughrue Mion, PLLC

(57) ABSTRACT

It is an object to provide a water-soluble preflux containing a low-volatile solubilizing agent excellent in performance to dissolve an imidazole compound in water and capable of bringing out an excellent film-forming property of the imidazole compound and also to provide a treating method for the surface of a metal conductive part which comprises bringing the surface into contact with the above water-soluble preflux.

4 Claims, No Drawings

WATER-SOLUBLE PREFLUX AND USAGE OF THE SAME

TECHNICAL FIELD

The present invention relates to a water-soluble preflux for use in soldering the surface of a metal conductive part constituting the circuit part of a printed wiring board for electronic parts and the like.

BACKGROUND ART

In recent years, surface mount technology with increased density has been widely adopted. Such surface mount technology are classified into double-sided surface mount technology in which chip type parts are joined with use of solder paste, and hybrid mount technology which is a combination of surface mount technology of chip type parts using solder paste and through-hole mount technology of discrete parts. In either mount process, a printed wiring board is subjected to two or more soldering steps, and thus it is exposed to high temperature resulting in a severe thermal history.

As a result, oxide film formation is accelerated by heating the metal surface of copper, a copper alloy, or silver of a metal conductive part constituting the circuit part of a printed wiring board, and thus the surface of the conductive part cannot maintain good solderability.

In order to protect the metal conductive part of the printed wiring board from air oxidation, a treatment of forming a chemical layer on the surface of the conductive part is widely performed using a surface treating agent. It is necessary, however, that good solderability be maintained by preventing the chemical layer from degenerating (i.e., being degraded) to protect the metal conductive part even after the metal conductive part has a thermal history of multiple cycles.

Since an imidazole compound has an excellent film-forming property, as such surface treating agents, water-soluble prefluxes containing various imidazole compounds have been proposed. For example, Patent Documents 1 to 4 disclose 2-alkylimidazole compounds such as 2-undecylimidazole, 2-arylimidazole compounds such as 2-phenylimidazole and 2-phenyl-4-methylimidazole, 2-alkylbenzimidazole compounds such as 2-nonylbenzimidazole, and 2-aralkylbenzimidazole compounds such as 2-(4-chlorophenylmethyl)benzimidazole.

Incidentally, since an imidazole compound is generally hardly soluble in water, it is necessary to dissolve it in water using as a solubilizing agent an organic acid or an inorganic acid which forms its water-soluble salt.

In recent years, there has been widely used, as a solubilizing agent, formic acid or acetic acid which has both of an excellent performance to dissolve an imidazole compound in water and an excellent performance to bring out a film-forming property of the imidazole compound. However, since these acid compounds are highly volatile and have irritating odor, there arise problems that the imidazole compound may precipitate owing to decrease in acid concentration in a water-soluble preflux and the acid compounds may invite deterioration of working environment.

Tin-lead alloy eutectic solders have been widely used in the aforementioned soldering. In recent years, however, concerns have developed that the lead contained in the solder alloys adversely affects the human body, and thus the use of lead-free solders is desired.

Accordingly, various lead-free solders are being investigated. For example, lead-free solders have been proposed in which a metal such as silver, zinc, bismuth, indium, antimony, or copper is added to a base metal of tin and a part thereof is put into practical use.

The conventionally used tin-lead alloy eutectic solders are excellent in wettability on the surface of a metal such as copper, a copper alloy, or silver of a metal conductive part, and thus strongly adheres to the metal, resulting in high reliability.

In contrast, a lead-free solder is inferior to the conventionally used tin-lead solders in wettability on a metal surface, and thus exhibits poor solderability and low bonding strength due to voids and other bonding defects.

Therefore, when using a lead-free solder, it is necessary to select a solder alloy with superior solderability and a flux suitable for the lead-free solder. A water-soluble preflux for use in preventing oxidation on the surface of a metal such as copper, a copper alloy, or silver of the metal conductive part is also required to have functions for improving the wettability and solderability of the lead-free solder.

Moreover, most of lead-free solders have a high melting point, and a soldering temperature is about 20 to about 50° C. higher than that of the conventionally used tin-lead eutectic solders. Thus, the water-soluble preflux is desired to have the characteristic of being able to form a chemical layer with excellent heat resistance.

Patent Document 1: JP-B-46-17046
Patent Document 2: JP-A-4-206681
Patent Document 3: JP-A-5-25407
Patent Document 4: JP-A-5-186888

DISCLOSURE OF THE INVENTION

Problems that the Invention is to Solve

In view of the foregoing circumstance, the invention has been made. An object is to provide a water-soluble preflux containing a low-volatile solubilizing agent excellent in performance to dissolve an imidazole compound in water and capable of bringing out an excellent film-forming property of the imidazole compound, and also to provide a treating method for the surface of a metal conductive part which comprises bringing the surface into contact with the above water-soluble preflux.

Also, another object is to provide a printed wiring board wherein the surface of a metal conductive part has been brought into contact with the above water-soluble preflux and a soldering method which comprises bringing the surface of a metal conductive part into contact with the above water-soluble preflux and subsequently soldering the surface.

Means for Solving the Problems

In order to solve the foregoing problems, the present inventors made extensive and intensive investigations. As a result, it has been found that a carboxylic acid compound having 4 to 16 carbon atoms represented by the following general formula 1 has an excellent performance to solubilize an imidazole compound in water and performance to bring out an excellent film-forming property of the imidazole compound and thus the invention has been accomplished.

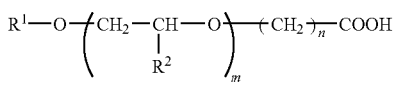

[Formula 1]

(wherein $R^1$ represents a linear or branched alkyl group having 1 to 4 carbon atoms, $R^2$ represents a hydrogen atom or a methyl group, m represents an integer of 0 to 3, and n represents 1 or 2.)

Namely, a first invention relates to a water-soluble preflux comprising an imidazole compound and a carboxylic acid compound having 4 to 16 carbon atoms represented by the above general formula 1.

A second invention relates to the water-soluble preflux, which comprises the imidazole compound in a proportion of from 0.01 to 10% by weight and the above carboxylic acid compound in a proportion of from 0.1 to 50% by weight.

A third invention relates to a surface treatment method for a metal conductive part, which comprises bringing the surface of the metal conductive part into contact with the water-soluble preflux according to the first or second invention.

A fourth invention relates to a printed wiring board, wherein the surface of a metal conductive part has been brought into contact with the water-soluble preflux according to the first or second invention.

A fifth invention relates to a soldering method, which comprises bringing the surface of a metal conductive part into contact with the water-soluble preflux according to the first or second invention and then performing soldering.

EFFECT OF THE INVENTION

Since the water-soluble preflux of the invention contains a low-volatile carboxylic acid compound as a solubilizing agent for imidazole compounds, it is possible to stably maintain the concentration of the solubilizing agent in the water-soluble preflux and no bad odor is generated. Moreover, as compared with the case where formic acid or acetic acid is used as a solubilizing agent, an excellent film-forming property of the imidazole compound can be brought out.

According to the surface treatment method of the invention, a chemical layer can be formed on the surface of a metal conductive part and hence oxidation of the surface of the metal conductive part can be prevented.

When the printed wiring board of the invention is used, the bonding between the metal conductive part and electronic parts can be securely performed by soldering.

According to the soldering method of the invention, oxidation of the surface of the metal conductive part can be prevented and hence the solderability can be made good.

BEST MODE FOR CARRYING OUT THE INVENTION

The following will explain the invention in detail.

The imidazole compound suitable for carrying out the invention is not particularly limited. Examples thereof include alkylimidazole compounds, arylimidazole compounds, aralkylimidazole compounds, alkylbenzimidazole compounds, arylbenzimidazole compounds, and aralkylbenzimidazole compounds.

As the above alkylimidazole compounds, there may be mentioned 1-decylimidazole, 2-methylimidazole, 2-undecylimidazole, 2-heptadecylimidazole, 2-ethyl-4-methylimidazole, 2-undecyl-4-methylimidazole, 4-methylimidazole, 4-octylimidazole, 2-cyclohexylimidazole, and the like.

As the above arylimidazole compounds, there may be mentioned 1-phenylimidazole, 2-phenylimidazole, 2-tolylimidazole, 2-(4-chlorophenyl)imidazole, 2-phenyl-4-methylimidazole, 2-phenyl-1-benzylimidazole, 2-phenyl-4-benzylimidazole, 2,4-diphenylimidazole, 2,4-diphenyl-5-methylimidazole, 2-phenyl-4-(3,4-dichlorophenyl) imidazole, 2-phenyl-4-(2,4-dichlorophenyl)-5-methylimidazole, 2-(2,4-dichlorophenyl)-4-phenyl-5-methylimidazole, 4-phenylimidazole, 2-nonyl-4-phenylimidazole, 4-phenyl-5-decylimidazole, 2-phenyl-4-methyl-5-benzylimidazole, 2-(1-naphthyl)imidazole, 2-(2-naphthyl)-4-(4-chlorophenyl)-5-methylimidazole, 2-phenyl-4-(2-naphthyl)imidazole, 2,4,5-triphenylimidazole, 2-(2,4-dichlorophenyl)-4,5-diphenylimidazole, 2-(1-naphthyl)-4,5-diphenylimidazole, 2-(4-pyridyl)-4,5-diphenylimidazole, and the like.

As the above aralkylimidazole compounds, there may be mentioned 1-benzylimidazole, 1-(4-chlorophenyl)methyl-2-methylimidazole, 2-benzylimidazole, 2-benzyl-4-methylimidazole, 2-(2-phenylethyl)imidazole, 2-(5-phenylpentyl)imidazole, 2-methyl-4,5-dibenzylimidazole, 1-(2,4-dichlorophenyl)methyl-2-benzylimidazole, 2-(1-naphthyl)methyl-4-methylimidazole, and the like.

As the above alkylbenzimidazole compounds, there may be mentioned 1-dodecyl-2-methylbenzimidazole, 2-propylbenzimidazole, 2-pentylbenzimidazole, 2-octylbenzimidazole, 2-nonylbenzimidazole, 2-heptadecylbenzimidazole, 2-hexyl-5-methylbenzimidazole, 2-pentyl-5,6-dichlorobenzimidazole, 2-(1-ethylpentyl)benzimidazole, 2-(2,4,4-trimethylpentyl)benzimidazole, 2-cyclohexylbenzimidazole, 2-(5-cyclohexylpentyl)benzimidazole, 2-phenoxymethylbenzimidazole, 2-(2-aminoethyl)benzimidazole, 2,2'-ethylenedibenzimidazole, 2-(mercaptomethyl)benzimidazole, 2-pentylmercaptobenzimidazole, and the like.

As the above arylbenzimidazole compounds, there may be mentioned 1-phenylbenzimidazole, 2-phenylbenzimidazole, 2-(4-chlorophenyl)benzimidazole, 1-benzyl-2-phenylbenzimidazole, 2-o-tolyl-5,6-dimethylbenzimidazole, 2-(1-naphthyl)-5-chlorobenzimidazole, 5-phenylbenzimidazole, 2-(2-pyridyl)benzimidazole, and the like.

As the above aralkylbenzimidazole compounds, there may be mentioned 1-benzylbenzimidazole, 2-benzylbenzimidazole, 2-(4-chlorophenyl)methylbenzimidazole, 2-(4-bromophenyl)methylbenzimidazole, 2-(2,4-dichlorophenyl)methylbenzimidazole, 2-(3,4-dichlorophenyl) methylbenzimidazole, 2-p-tolylmethyl-5,6-dichlorobenzimidazole, 1-allyl-2-(4-chlorophenyl) methylbenzimidazole, 2-(2-phenylethyl)benzimidazole, 2-(3-phenylpropyl)-5-methylbenzimidazole, 2-(1-naphthyl)methylbenzimidazole, 2-(2-phenylvinyl)benzimidazole, 2-(benzylmercapto)benzimidazole, 2-(2-benzylmercaptoethyl)benzimidazole, and the like.

These imidazole compounds may be contained in the water-soluble preflux in a proportion of from 0.01 to 10% by weight, preferably from 0.1 to 5% by weight. When the proportion of the imidazole compound contained is less than 0.01% by weight, the chemical layer formed on the metal surface becomes thin and thus the oxidation of the metal surface cannot be sufficiently prevented. When the proportion of the imidazole compound contained is more than 10% by weight, it becomes difficult to control the surface treatment for obtaining a desired layer thickness suitable for soldering conditions.

In carrying out the invention, the carboxylic acid compound having 4 to 16 carbon atoms represented by the above general formula 1 is used as a solubilizing agent when the water-soluble preflux is prepared by solubilizing (converting into an aqueous solution) an imidazole compound.

According to the findings of the present inventors, performance to solubilize imidazole compounds can be enhanced by using the carboxylic acid compound having a chemical structure wherein an alkoxy group ($R^1$—O—) and a carboxymethyl group (—$CH_2COOH$) or a carboxyethyl group (—$C_2H_4COOH$) is combined via an alkylene ether chain (—$CH_2CH(R^2)$—O—), so that m is preferably from 1 to 3.

Moreover, the carboxylic acid compound having 3 carbon atoms is methoxyacetic acid but the substance is reported to be difficult to metabolize in the living body and to have an effect of causing testicular atrophy or teratogenicity, so that its commercial use is not preferred.

Among the carboxylic acid compounds having 4 to 16 carbon atoms represented by the above general formula 1, the carboxylic acid compounds having 4 to 16 carbon atoms represented by the following general formula 2, which are the cases that n is 1, can be synthesized in accordance with the method as described in "Yukagaku, Vol. 32, p. 118 (1983)". Namely, as shown in the reaction scheme of the formula 3, an excess of an alcohol compound is reacted with a predetermined molar amount of metal sodium and then monochloroacetic acid is added thereto in an amount of 0.5 molar equivalent to metal sodium, followed by heating to effect a reaction. After completion of the reaction, excessive alcohol compound is removed by distillation under reduced pressure and adequate amount of concentrated hydrochloric acid for neutralization is added and extracted by an ether etc. Then the extract such as the ether is concentrated under reduced pressure, and the resulting concentrate is distilled under reduced pressure, whereby the carboxylic acid compound can be obtained.

[Formula 2]

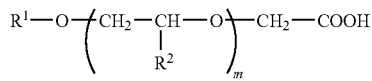

(wherein $R^1$ represents a linear or branched alkyl group having 1 to 4 carbon atoms, $R^2$ represents a hydrogen atom or a methyl group, and m represents an integer of 0 to 3.)

[Formula 3]

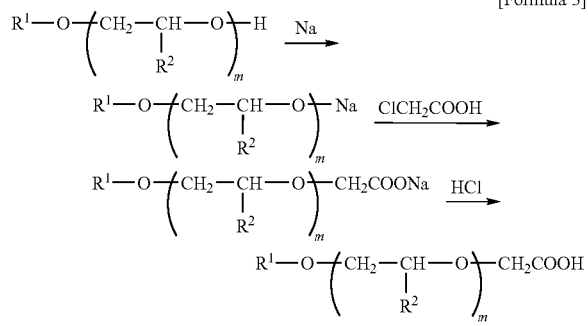

(wherein $R^1$ represents a linear or branched alkyl group having 1 to 4 carbon atoms, $R^2$ represents a hydrogen atom or a methyl group, and m represents an integer of 0 to 3.)

The carboxylic acid compound in the case where m shown in the above formula 2 is 0 is ethoxyacetic acid, propoxyacetic acid, isopropoxyacetic acid, butoxyacetic acid, isobutoxyacetic acid, sec-butoxyacetic acid, or tert-butoxyacetic acid.

Similarly, the carboxylic acid compound in the case where m is 1 and $R^2$ is a hydrogen atom is 2-(2-methoxyethoxy)acetic acid, 2-(2-ethoxyethoxy)acetic acid, 2-(2-propoxyethoxy)acetic acid, 2-(2-isopropoxyethoxy)acetic acid, 2-(2-butoxyethoxy)acetic acid, 2-(2-isobutoxyethoxy)acetic acid, 2-(2-sec-butoxyethoxy)acetic acid, or 2-(2-tert-butoxyethoxy)acetic acid.

Similarly, the carboxylic acid compound in the case where m is 2 and $R^2$ is a hydrogen atom is 2-[2-(2-methoxyethoxy)ethoxy]acetic acid, 2-[2-(2-ethoxyethoxy)ethoxy]acetic acid, 2-[2-(2-propoxyethoxy)ethoxy]acetic acid, 2-[2-(2-isopropoxyethoxy)ethoxy]acetic acid, 2-[2-(2-butoxyethoxy)ethoxy]acetic acid, 2-[2-(2-isobutoxyethoxy)ethoxy]acetic acid, 2-[2-(2-sec-butoxyethoxy)ethoxy]acetic acid, or 2-[2-(2-tert-butoxyethoxy)ethoxy]acetic acid.

Similarly, the carboxylic acid compound in the case where m is 3 and $R^2$ is a hydrogen atom is 2-{2-[2-(2-methoxyethoxy)ethoxy]ethoxy}acetic acid, 2-{2-[2-(2-ethoxyethoxy)ethoxy]ethoxy}acetic acid, 2-{2-[2-(2-propoxyethoxy)ethoxy]ethoxy}acetic acid, 2-{2-[2-(2-isopropoxyethoxy)ethoxy]ethoxy}acetic acid, 2-{2-[2-(2-butoxyethoxy)ethoxy]ethoxy}acetic acid, 2-{2-[2-(2-isobutoxyethoxy)ethoxy]ethoxy}acetic acid, 2-{2-[2-(2-sec-butoxyethoxy)ethoxy]ethoxy}acetic acid, or 2-{2-[2-(2-tert-butoxyethoxy)ethoxy]ethoxy}acetic acid.

Similarly, the carboxylic acid compound in the case where m is 1 and $R^2$ is a methyl group is 2-(2-methoxy-1-methylethoxy)acetic acid, 2-(2-ethoxy-1-methylethoxy)acetic acid, 2-(2-propoxy-1-methylethoxy)acetic acid, 2-(2-isopropoxy-1-methylethoxy)acetic acid, 2-(2-butoxy-1-methyl ethoxy)acetic acid, 2-(2-isobutoxy-1-methylethoxy)acetic acid, 2-(2-sec-butoxy-1-methylethoxy)acetic acid, or 2-(2-tert-butoxy-1-methylethoxy)acetic acid.

Similarly, the carboxylic acid compound in the case where m is 2 and $R^2$ is a methyl group is 2-[2-(2-methoxy-1-methylethoxy)-1-methylethoxy]acetic acid, 2-[2-(2-ethoxy-1-methylethoxy)-1-methylethoxy]acetic acid, 2-[2-(2-propoxy-1-methylethoxy)-1-methylethoxy]acetic acid, 2-[2-(2-isopropoxy-1-methylethoxy)-1-methylethoxy]acetic acid, 2-[2-(2-butoxy-1-methylethoxy)-1-methylethoxy]acetic acid, 2-[2-(2-isobutoxy-1-methylethoxy)-1-methylethoxy]acetic acid, 2-[2-(2-sec-butoxy-1-methylethoxy)-1-methylethoxy]acetic acid, or 2-[2-(2-tert-butoxy-1-methylethoxy)-1-methylethoxy]acetic acid.

Similarly, the carboxylic acid compound in the case where m is 3 and $R^2$ is a methyl group is 2-{2-[2-(2-methoxy-1-methylethoxy)-1-methylethoxy]-1-methylethoxy}acetic acid, 2-{2-[2-(2-ethoxy-1-methylethoxy)-1-methylethoxy]-1-methylethoxy}acetic acid, 2-{2-[2-(2-propoxy-1-methylethoxy)-1-methylethoxy]-1-methylethoxy}acetic acid, 2-{2-[2-(2-isopropoxy-1-methylethoxy)-1-methylethoxy]-1-methylethoxy}acetic acid, 2-{2-[2-(2-butoxy-1-methylethoxy)-1-methylethoxy]-1-methylethoxy)acetic acid, 2-(2-[2-(2-isobutoxy-1-methylethoxy]-1-methylethoxy}acetic acid, 2-{2-[2-(2-sec-butoxy-1-methylethoxy)-1-methylethoxy]-1-methylethoxy}acetic acid, or 2-{2-[2-(2-tert-butoxy-1-methylethoxy)-1-methylethoxy]-1-methylethoxy}acetic acid.

Among the carboxylic acid compounds having 4 to 16 carbon atoms represented by the above general formula 1, the carboxylic acid compounds having 4 to 16 carbon atoms represented by the following general formula 4, which are the cases that n is 2, can be synthesized in accordance with the method using cyanoethyl ether compounds as starting materials as described in "J. Am. Chem. Soc., Vol. 70, p. 1333 (1948)".

The cyanoethyl ether compounds can be synthesized in accordance with the methods as described in "British Patent No. 544421" and "U.S. Pat. No. 2,280,792".

Namely, as shown in the reaction scheme of the formula 5, an alcohol compound is reacted with acrylonitrile in the presence of an alkali catalyst such as sodium ethoxide, and after neutralization, the reaction product is distilled under reduced pressure to synthesize a cyanoethyl ether compound. The cyanoethyl ether compound is heated in an aqueous solution of a strong acid such as hydrochloric acid to effect a reaction, the reaction mixture is concentrated, precipitated ammonium salt such as ammonium chloride is removed by filtration, and then the filtrate is distilled under reduced pressure, whereby the carboxylic acid compound can be obtained.

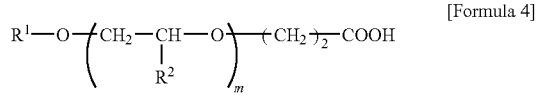

[Formula 4]

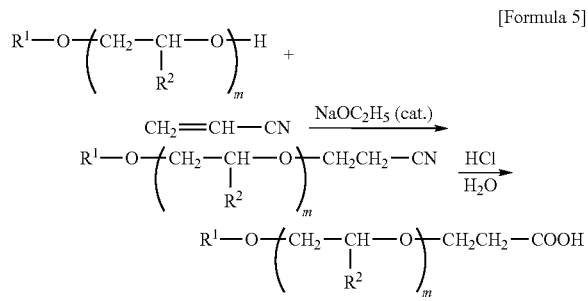

[Formula 5]

(wherein $R^1$ represents a linear or branched alkyl group having 1 to 4 carbon atoms, $R^2$ represents a hydrogen atom or a methyl group, and m represents an integer of 0 to 3.)

The carboxylic acid compound in the case where m shown in the above formula 4 is 0 is 3-ethoxypropionic acid, 3-propoxypropionic acid, 3-isopropoxypropionic acid, 3-butoxypropionic acid, 3-isobutoxypropionic acid, 3-sec-butoxypropionic acid, or 3-tert-butoxypropionic acid.

Similarly, the carboxylic acid compound in the case where m is 1 and $R^2$ is a hydrogen atom is 3-(2-methoxyethoxy)propionic acid, 3-(2-ethoxyethoxy)propionic acid, 3-(2-propoxyethoxy)propionic acid, 3-(2-isopropoxyethoxy)propionic acid, 3-(2-butoxyethoxy)propionic acid, 3-(2-isobutoxyethoxy)propionic acid, 3-(2-sec-butoxyethoxy)propionic acid, or 3-(2-tert-butoxyethoxy)propionic acid.

Similarly, the carboxylic acid compound in the case where m is 2 and $R^2$ is a hydrogen atom is 3-[2-(2-methoxyethoxy)ethoxy]propionic acid, 3-[2-(2-ethoxyethoxy)ethoxy]propionic acid, 3-[2-(2-propoxyethoxy)ethoxy]propionic acid, 3-[2-(2-isopropoxyethoxy)ethoxy]propionic acid, 3-[2-(2-butoxyethoxy)ethoxy]propionic acid, 3-[2-(2-isobutoxyethoxy)ethoxy]propionic acid, 3-[2-(2-sec-butoxyethoxy)ethoxy]propionic acid, or 3-[2-(2-tert-butoxyethoxy)ethoxy]propionic acid.

Similarly, the carboxylic acid compound in the case where m is 3 and $R^2$ is a hydrogen atom is 3-{2-[2-(2-methoxyethoxy)ethoxy]ethoxy}propionic acid, 3-{2-[2-(2-ethoxyethoxy)ethoxy]ethoxy}propionic acid, 3-{2-[2-(2-propoxyethoxy)ethoxy]ethoxy}propionic acid, 3-{2-[2-(2-isopropoxyethoxy)ethoxy]ethoxy}propionic acid, 3-{2-[2-(2-butoxyethoxy)ethoxy]ethoxy}propionic acid, 3-{2-[2-(2-isobutoxyethoxy)ethoxy]ethoxy}propionic acid, 3-{2-[2-(2-sec-butoxyethoxy)ethoxy]ethoxy}propionic acid, or 3-{2-[2-(2-tert-butoxyethoxy)ethoxy]ethoxy}propionic acid.

Similarly, the carboxylic acid compound in the case where m is 1 and $R^2$ is a methyl group is 3-(2-methoxy-1-methylethoxy)propionic acid, 3-(2-ethoxy-1-methylethoxy)propionic acid, 3-(2-propoxy-1-methylethoxy)propionic acid, 3-(2-isopropoxy-1-methylethoxy)propionic acid, 3-(2-butoxy-1-methylethoxy)propionic acid, 3-(2-isobutoxy-1-methylethoxy)propionic acid, 3-(2-sec-butoxy-1-methylethoxy)propionic acid, or 3-(2-tert-butoxy-1-methylethoxy)propionic acid.

Similarly, the carboxylic acid compound in the case where m is 2 and $R^2$ is a methyl group is 3-[2-(2-methoxy-1-methylethoxy)-1-methylethoxy]propionic acid, 3-[2-(2-ethoxy-1-methylethoxy)-1-methylethoxy]propionic acid, 3-[2-(2-propoxy-1-methylethoxy)-1-methylethoxy]propionic acid, 3-[2-(2-isopropoxy-1-methylethoxy)-1-methylethoxy]propionic acid, 3-[2-(2-butoxy-1-methylethoxy)-1-methylethoxy]propionic acid, 3-[2-(2-isobutoxy-1-methylethoxy)-1-methylethoxy]propionic acid, 3-[2-(2-sec-butoxy-1-methylethoxy)-1-methylethoxy]propionic acid, or 3-[2-(2-tert-butoxy-1-methylethoxy)-1-methylethoxy]propionic acid.

Similarly, the carboxylic acid compound in the case where m is 3 and $R^2$ is a methyl group is 3-(2-[2-(2-methoxy-1-methylethoxy)-1-methylethoxy]-1-methylethoxypropionic acid, 3-{2-[2-(2-ethoxy-1-methylethoxy)-1-methylethoxy]-1-methylethoxy}propionic acid, 3-{2-[2-(2-propoxy-1-methylethoxy)-1-methylethoxy]-1-methylethoxy)propionic acid, 3-{2-[2-(2-isopropoxy-1-methylethoxy)-1-methylethoxy]-1-methylethoxy}propionic acid, 3-(2-[2-(2-butoxy-1-methylethoxy)-1-methylethoxy]-1-methylethoxy}propionic acid, 3-{2-[2-(2-isobutoxy-1-methylethoxy)-1-methylethoxy]-1-methylethoxy}propionic acid, 3-(2-[2-(2-sec-butoxy-1-methylethoxy)-1-methylethoxy]-1-methylethoxy)propionic acid, or 3-{2-[2-(2-tert-butoxy-1-methylethoxy)-1-methylethoxy]-1-methylethoxy}propionic acid.

These carboxylic acid compounds may be contained in a water-soluble preflux in a proportion of from 0.1 to 50% by weight, preferably from 1 to 30% by weight. In the case where the proportion of the carboxylic acid contained is less than 0.1% by weight, the imidazole compound cannot be sufficiently solubilized. In the case where the proportion is more than 50% by weight, the agent cost of the carboxylic acid increases and thus the case is not preferred.

In carrying out the invention, a conventionally known organic acid, inorganic acid, or organic solvent may be used as a solubilizing agent in combination with the carboxylic acid compound.

Representative examples of the organic acid to be used include formic acid, acetic acid, propionic acid, butyric acid, glyoxylic acid, pyruvic acid, acetoacetic acid, levulinic acid, heptanoic acid, caprylic acid, capric acid, lauric acid, glycolic acid, glyceric acid, lactic acid, acrylic acid, benzoic acid, p-nitrobenzoic acid, p-toluenesulfonic acid, salicylic acid, picric acid, oxalic acid, succinic acid, maleic acid, fumaric acid, tartaric acid, and adipic acid; and examples of the inorganic acid include hydrochloric acid, phosphoric acid, sulfuric acid, and nitric acid.

Also, as the organic solvent, there may be mentioned lower alcohols such as methanol, ethanol, and isopropyl alcohol; or acetone, N,N-dimethylformamide, ethylene glycol, and the like, which are freely miscible with water.

To the water-soluble preflux of the invention, a copper compound may be added in order to accelerate a formation rate of the chemical layer on the surface of the metal conductive part and a zinc compound may be added in order to further enhance heat resistance of the chemical layer formed.

Representative examples of the above copper compound include copper acetate, cuprous chloride, cupric chloride, cuprous bromide, cupric bromide, copper iodide, copper hydroxide, copper phosphate, copper sulfate, and copper nitrate, and the like; and representative examples of the zinc compound include zinc oxide, zinc formate, zinc acetate, zinc oxalate, zinc lactate, zinc citrate, zinc sulfate, zinc nitrate, zinc phosphate, and the like. Any of the metal compounds may be added in a proportion of from 0.01 to 10% by weight, preferably a proportion of from 0.02 to 5% by weight in the water-soluble preflux.

In the case where such a copper compound or zinc compound is used, it is preferable to stabilize the pH of the water-soluble preflux by adding a substance having a buffer action, such as ammonia or an amine such as monoethanolamine, diethanolamine, or triethanolamine into the water-soluble preflux.

In order to further enhance the formation rate of the chemical layer and the heat resistance of the layer, a halogen compound may be added in a proportion of from 0.001 to 1% by weight, preferably a proportion of from 0.01 to 0.5% by weight into the water-soluble preflux of the invention. Examples of the halogen compound include sodium fluoride, potassium fluoride, ammonium fluoride, sodium chloride, potassium chloride, ammonium chloride, sodium bromide, potassium bromide, ammonium bromide, sodium iodide, potassium iodide, and ammonium iodide.

With respect to the conditions for treating the surface of the metal conductive part of the printed wiring board using the water-soluble preflux of the invention, the liquid temperature of the water-soluble preflux is preferably from 10 to 70° C., and the contact time is preferably from 1 second to 10 minutes. As the contact method, there may be mentioned dipping, spraying, coating, and the like methods.

Also, after performing the surface treatment according to the invention, it is possible to further enhance the heat resistance by forming a double structure on the chemical layer with a thermoplastic resin.

That is, after forming the chemical layer on the surface of the metal conductive layer, a double structure of the chemical layer and a thermoplastic resin may be formed by dissolving a thermoplastic resin having excellent heat resistance, which may be composed of a rosin derivative such as rosin or a rosin ester, a terpene resin derivative such as a terpene resin or a terpene phenol resin, a hydrocarbon resin such as an aromatic hydrocarbon resin or an aliphatic hydrocarbon resin, or a mixture thereof, in a solvent such as toluene, ethyl acetate, or isopropyl alcohol and uniformly applying the solution so as to be a thickness of 1 to 30 μm on the chemical layer using a roll coater or the like.

The soldering method of the invention can be adapted to the flow soldering method which comprises moving a printed wiring board over a molten liquid-state solder in a solder bath to solder junctions between electronic parts and the printed wiring board and the reflow soldering method which comprises printing in advance a paste cream solder on the printed wiring board according to a circuit pattern, mounting electronic parts thereon, and heating the whole printed wiring board to melt the solder to complete the soldering.

As the solder which is suitable for soldering according to the invention, there may be mentioned not only generally used tin-lead alloy eutectic solders but also lead-free solders such as Sn—Ag—Cu based, Sn—Ag—Bi based, Sn—Bi based, Sn—Ag—Bi—In based, Sn—Zn based, and Sn—Cu based solders.

EXAMPLES

The following will specifically describe the invention with reference to Examples and Comparative Examples but it should not be construed that the invention is limited thereto.

Incidentally, the imidazole compounds, carboxylic acid compounds, and evaluation methods used in Examples and Comparative Examples are as follows.

[Imidazole Compounds]
  2-Undecylimidazole (a trade name: C11Z, manufactured by Shikoku Chemicals Corporation)
  2-Phenylimidazole (a trade name: 2PZ, manufactured by Shikoku Chemicals Corporation)
  2-Phenyl-4-methylimidazole (a trade name: 2P4MZ, manufactured by Shikoku Chemicals Corporation)
  2-Phenyl-4-(3,4-dichlorophenyl)imidazole (synthesized according to the method as described in JP-A-2005-104878)
  2-Phenyl-4-(2-naphthyl)-5-methylimidazole (synthesized according to the method of Reference Example 1)
  2-Phenyl-4-(2-naphthyl)imidazole (synthesized according to the method of Reference Example 2)
  2-Benzyl-4-methylimidazole (manufactured by Poly Organix)
  2-Nonylbenzimidazole (a reagent, manufactured by SIGMA-ALDRICH)
  2-(4-chlorophenylmethyl)benzimidazole (synthesized according to the method as described in Science of Synthesis, Vol. 12, p. 529 (2002))
  2-(1-naphthyl)methylbenzimidazole (synthesized according to the method as described in Biochemical Pharmacology, Vol. 36, p. 463 (1987))

Reference Example 1

Synthetic method of
2-Phenyl-4-(2-naphthyl)-5-methylimidazole

Benzamidine hydrochloride and an equimolar amount of sodium methylate were heated under reflux in tetrahydrofuran for 1 hour. After cooling, a tetrahydrofuran solution of an equimolar amount of 2-bromo-2'-propionaphthone was added dropwise thereto so that the temperature did not exceed 30° C., and then an equimolar amount of sodium methylate was further added, followed by heating under reflux for 1 hour. After removal of the solvent by distillation under reduced pressure, the residue was washed with water and subjected to recrystallization from acetonitrile to obtain grayish blue crystals.

Reference Example 2

Synthetic method of
2-Phenyl-4-(2-naphthyl)imidazole

Benzamidine hydrochloride and an equimolar amount of sodium methylate were heated under reflux in tetrahydrofuran for 1 hour. After cooling, a tetrahydrofuran solution of an equimolar amount of ω-bromo-2-acetonaphthone was added dropwise thereto so that the temperature did not exceed 30° C., and then an equimolar amount of sodium methylate was further added, followed by heating under reflux for 1 hour. After removal of the solvent by distillation under reduced pressure, the residue was washed with water and subjected to recrystallization from acetonitrile to obtain grayish blue crystals.

(Carboxylic Acid Compounds)

2-Ethoxyacetic acid (a reagent, manufactured by SIGMA-ALDRICH, abbreviated as Compound A)

2-(2-methoxyethoxy)acetic acid (abbreviated as Compound B)

2-[2-(2-ethoxyethoxy)ethoxy]acetic acid (abbreviated as Compound C)

2-{2-[2-(2-ethoxyethoxy)ethoxy]ethoxy}acetic acid (abbreviated as Compound D)

2-(2-methoxy-1-methylethoxy)acetic acid (abbreviated as Compound E)

2-[2-(2-propoxy-1-methylethoxy)-1-methylethoxy]acetic acid (abbreviated as Compound F)

2-{2-[2-(2-butoxy-1-methylethoxy)-1-methylethoxy]-1-methylethoxy}acetic acid (abbreviated as Compound G)

3-Ethoxypropionic acid (abbreviated as Compound H)

3-(2-methoxyethoxy)propionic acid (abbreviated as Compound I)

3-(2-methoxy-1-methylethoxy)propionic acid (abbreviated as Compound J)

3-[2-(2-methoxyethoxy)ethoxy]propionic acid (abbreviated as Compound K)

3-{2-[2-(2-ethoxyethoxy)ethoxy]ethoxy}propionic acid (abbreviated as Compound L)

Compounds B to G were synthesized in accordance with the method as described in "Yukagaku, Vol. 32, p. 118 (1983)".

Compounds H to L were synthesized in accordance with the methods as described in "J. Am. Chem. Soc., Vol. 70, p. 1333 (1948)" and "British Patent No. 544421" and/or "U.S. Pat. No. 2,280,792".

In this regard, the structural formulae of Compounds A to L are as shown in Table 1.

TABLE 1

| Compound A | $C_2H_5$—O—$CH_2COOH$ |
|---|---|
| Compound B | $CH_3$—O—$CH_2$—CH(H)—O—$CH_2COOH$ |
| Compound C | $C_2H_5$—O—($CH_2$—CH(H)—O)$_2$—$CH_2COOH$ |
| Compound D | $C_2H_5$—O—($CH_2$—CH(H)—O)$_3$—$CH_2COOH$ |
| Compound E | $CH_3$—O—$CH_2$—CH($CH_3$)—O—$CH_2COOH$ |
| Compound F | n-$C_3H_7$—O—($CH_2$—CH($CH_3$)—O)$_2$—$CH_2COOH$ |
| Compound G | n-$C_4H_9$—O—($CH_2$—CH($CH_3$)—O)$_3$—$CH_2COOH$ |
| Compound H | $C_2H_5$—O—$CH_2CH_2COOH$ |
| Compound I | $CH_3$—O—$CH_2$—CH(H)—O—$CH_2CH_2COOH$ |
| Compound J | $CH_3$—O—$CH_2$—CH($CH_3$)—O—$CH_2CH_2COOH$ |
| Compound K | $CH_3$—O—($CH_2$—CH(H)—O)$_2$—$CH_2CH_2COOH$ |
| Compound L | $C_2H_5$—O—($CH_2$—CH(H)—O)$_3$—$CH_2CH_2COOH$ |

Reference Example 3

Solubilization Test of Imidazole Compounds

After 0.20 g of 2-pheny-(3,4-dichlorophenyl)imidazole was dissolved in 2.0 g of the carboxylic acid compound for use in the invention, there was measured an amount of water required until the solution became clouded when ion-exchange water was added. The larger amount of water is judged to be more excellent in imidazole compound-solubilization performance of the carboxylic acid compound.

The obtained test results are as shown in Tables 2 to 4. It is recognized that a chemical structure wherein an alkoxy group ($R^1$—O—) and a carboxymethyl group (—$CH_2COOH$) or a carboxyethyl group (—$C_2H_4COOH$) is combined via an alkylene ether chain (—$CH_2CH(R^2)$—O—) enhances the imidazole compound-solubilization performance.

TABLE 2

| Carboxylic acid compound | Amount of water added (ml) |
|---|---|
| 2-Ethoxyacetic acid | 3.3 |
| Compound C | 3.6 |

TABLE 3

| Carboxylic acid compound | Amount of water added (ml) |
|---|---|
| 2-(n-Propoxy)acetic acid | 2.8 |
| Compound F | 3.0 |

TABLE 4

| Carboxylic acid compound | Amount of water added (ml) |
|---|---|
| 2-(n-Butoxy)acetic acid | 1.0 |
| Compound G | 2.0 |

(Evaluation Test for Solder Flow-Up Rate Properties)

A printed wiring board made of a glass epoxy resin of 120 mm (length)×150 mm (width)×1.6 mm (thickness) and having 300 copper through-holes having an inner diameter of 0.80 mm was used as a test piece. This test piece was degreased, subjected to soft etching, and then washed with water. Thereafter, the test piece was dipped in a water-soluble preflux kept at a prescribed liquid temperature for a prescribed period of time, washed with water, and then dried to form a chemical layer having a thickness of from about 0.10 to 0.50 µm on the copper surface.

The surface-treated test piece was subjected to three cycles of reflow-heating in which the peak temperature was 240° C. using an infrared reflow device (trade name: MULTI-PRO-306, manufactured by Vetronix Co., Ltd.) and subsequently soldering was performed with a flow soldering device (conveyor speed: 1.0 m/min).

The solder used was a tin-lead eutectic solder with a composition of 63% tin and 37% lead (% by weight) (trade name: H63A, manufactured by Senju Metal Industry Co., Ltd.), and the flux used for soldering was JS-64MSS (manufactured by Koki Co., Ltd.). The soldering temperature was 240° C.

A test piece surface treated as above was also soldered using a lead-free solder in the same manner as in the case of the tin-lead eutectic solder. The solder used was a lead-free solder (trade name: H705 "ECOSOLCER", manufactured by Senju Metal Industry Co., Ltd.) with a composition of 96.5% tin, 3.0% silver and 0.5% copper (% by weight), and the flux used for soldering was JS-E-09 (manufactured by Koki Co., Ltd.). The reflow-heating peak temperature was 245° C., and the soldering temperature was also 245° C.

For the soldered test piece, the number of through-holes in which the solder was filled up to the upper land of the copper through-holes was counted and the proportion (%) thereof with respect to the total number of copper through-holes (300 holes) was calculated.

When the solder wettability on the copper surface is large, the molten solder penetrates into the inside of the copper through-hole and readily fills it to the upper land of the through-hole. Namely, when the number of through-holes whose upper lands were soldered is large, solder wettability to the copper may be judged to be excellent and solderability thereto may be judged to be good.

(Evaluation Test for Solder Spreadability)

A printed wiring board made of a glass epoxy resin of 50 mm (length)×50 mm (width)×1.2 mm (thickness) was used as a test piece. This printed wiring board had a circuit pattern in which 10 pieces of a copper foiled circuit with a width of 0.80 mm and a length of 20 mm were formed in a width direction at intervals of 1.0 mm. The test piece was degreased, subjected to soft etching, and then washed with water. Thereafter, the test piece was dipped in a water-soluble preflux kept at a prescribed liquid temperature for a prescribed period of time, washed with water, and then dried to form a chemical layer having a thickness of from about 0.10 to 0.50 µm on the copper surface.

The surface-treated test piece was subjected to one cycle of reflow-heating in which the peak temperature was 240° C. using an infrared reflow device (trade name: MULTI-PRO-306, manufactured by Vetronix Co., Ltd.). Thereafter a tin-lead solder paste was printed on the center of the copper circuits using a metal mask of 1.2 mm aperture diameter and 150 mm thickness, and reflow-heating was conducted under the above-described conditions to perform soldering. The tin-lead solder paste used was an eutectic solder (trade name: OZ-63-330F-40-10, manufactured by Senju Metal Industry Co., Ltd.) composed of 63% tin and 37% lead (% by weight).

A test piece surface treated as above was also soldered using a lead-free solder paste in the same manner as in the case of the tin-lead solder paste. The lead-free solder paste used was a lead-free solder composed of 96.5% tin, 3.0% silver and 0.5% copper (% by weight) (trade name: M705-221BM5-42-11, manufactured by Senju Metal Industry Co., Ltd.). The peak temperature of reflow-heating attained before and after the solder paste printing was set to 245° C.

The length (mm) of the solder which wetted and spread over the surface of the copper circuit of the obtained test piece was measured.

When the length is longer, solder wettability to the copper may be judged to be excellent and solderability thereto may be judged to be good.

Example 1

2-Undecylimidazole as an imidazole compound, ethoxyacetic acid as a solubilizing agent, copper acetate as a metal salt, and ammonium chloride as a halogen compound were dissolved in ion-exchange water so as to achieve the composition described in Table 5, respectively and subsequently the solution was adjusted to pH 3.7 with ammonia water, whereby a water-soluble preflux was prepared.

Then, a test piece of the printed wiring board was dipped in the water-soluble preflux whose temperature was controlled to 40° C. Thereafter, the test piece was washed and dried, and the solder flow-up rate properties and solder spreadability were measured. These test results are shown in Table 5.

Examples 2 to 16

Each water-soluble preflux having a composition as described in Table 5 was prepared in the same manner as in Example 1 and subjected to a surface treatment under the treatment conditions as described in Table 5. Then, the evaluation tests were performed. The obtained test results are shown in Table 5.

TABLE 5

| | Example | | | | | | | |
|---|---|---|---|---|---|---|---|---|
| | 1 | 2 | 3 | 4 | 5 | 6 | 7 | 8 |
| Composition of surface treating agent (% by weight) | | | | | | | | |
| Imidazole | | | | | | | | |
| 2-Undecylimidazole | 0.5 | | | | | | | |
| 2-Phenylimidazole | | 0.5 | | | | | | |
| 2-Phenyl-4-methylimidazole | | | 0.5 | | | | | |
| 2-Phenyl-4-(3,4-dichlorophenyl)imidazole | | | | 0.25 | | | | |
| 2-Phenyl-(2-naphthyl)-5-methylimidazole | | | | | 0.25 | | | |

TABLE 5-continued

| | Example 1 | Example 2 | Example 3 | Example 4 | Example 5 | Example 6 | Example 7 | Example 8 |
|---|---|---|---|---|---|---|---|---|
| 2-Phenyl-4-(2-naphthyl)imidazole | | | | | | 0.25 | | |
| 2-Benzyl-4-methylimidazole | | | | | | | 0.25 | |
| 2-Nonylbenzimidazole | | | | | | | | 0.25 |
| 2-(4-Chlorophenyl)methylbenzimidazole | | | | | | | | |
| 2-(1-Naphthyl)methylbenzimidazole | | | | | | | | |
| Solubilizing agent | | | | | | | | |
| Compound A | 1 | 5 | 5 | | | | | |
| Compound B | | | | 20 | | | | |
| Compound C | | | | | 30 | | | |
| Compound D | | | | | | 10 | | |
| Compound E | | | | | | | 3 | |
| Compound F | | | | | | | | 10 |
| Compound G | | | | | | | | |
| Compound H | | | | | | | | |
| Compound I | | | | | | | | |
| Compound J | | | | | | | | |
| Compound K | | | | | | | | |
| Compound L | | | | | | | | |
| Formic acid | | | | | | | | |
| Acetic acid | | | | | | | | 2 |
| Metal salt | | | | | | | | |
| Copper acetate | 0.03 | | | | | | | |
| Cuprous chloride | | | | | | | | |
| Cuprous bromide | | | 0.07 | | | | | |
| Cupric chloride | | | | 0.15 | | 0.15 | | |
| Cupric bromide | | | | | 0.15 | | | 0.15 |
| Zinc acetate | | | | | | 0.20 | 1.00 | |
| Zinc chloride | | | | | | | | 0.10 |
| Halogen | | | | | | | | |
| Ammonium chloride | 0.10 | | | | | | | |
| Potassium chloride | | 0.15 | | | | | | 0.30 |
| Ammonium bromide | | | | | | | | 0.08 |
| Potassium bromide | | | | 0.09 | | | | |
| Ammonium iodide | | | | | 0.07 | | | |
| Potassium iodide | | | | | | 0.08 | | |
| Copper iodide | | | | | | | 0.09 | |
| pH | 3.7 | 3.3 | 3.4 | 2.4 | 2.5 | 2.4 | 4.2 | 2.9 |
| Treatment conditions | | | | | | | | |
| Treatment temperature (°C) | 40 | 50 | 50 | 40 | 30 | 50 | 50 | 30 |
| Treatment time (sec) | 60 | 180 | 90 | 120 | 180 | 30 | 240 | 60 |
| Evaluation test | | | | | | | | |
| Solder flow-up rate properties (%) — Tin-lead based eutectic solder (240° C.) | 25 | 31 | 34 | 100 | 100 | 100 | 22 | 82 |
| Solder flow-up rate properties (%) — Lead-free solder (245° C.) | 10 | 21 | 18 | 100 | 100 | 100 | 15 | 61 |
| Solder spreadability (mm) — Tin-lead based eutectic solder (240° C.) | 1.92 | 2.12 | 2.16 | 3.88 | 3.82 | 3.75 | 2.08 | 2.46 |
| Solder spreadability (mm) — Lead-free solder (245° C.) | 1.39 | 1.39 | 1.41 | 1.68 | 1.66 | 1.70 | 1.40 | 1.51 |

| | Example 9 | Example 10 | Example 11 | Example 12 | Example 13 | Example 14 | Example 15 | Example 16 |
|---|---|---|---|---|---|---|---|---|
| Composition of surface treating agent (% by weight) | | | | | | | | |
| Imidazole | | | | | | | | |
| 2-Undecylimidazole | | | | | | | | |
| 2-Phenylimidazole | | | | | | | | |
| 2-Phenyl-4-methylimidazole | | | | 0.50 | | | | |
| 2-Phenyl-4-(3,4-dichlorophenyl)imidazole | | | | | 0.20 | | | |
| 2-Phenyl-(2-naphthyl)-5-methylimidazole | | | | | | | 0.25 | |
| 2-Phenyl-4-(2-naphthyl)imidazole | | | | | | | | 0.20 |
| 2-Benzyl-4-metnylimidazole | | | | | | 0.25 | | |
| 2-Nonylbenzimidazole | 0.25 | | | | | | | |
| 2-(4-Chlorophenyl)methylbenzimidazole | | 0.25 | | | | | | |
| 2-(1-Naphthyl)methylbenzimidazole | | | 0.20 | | | | | |
| Solubilizing agent | | | | | | | | |
| Compound A | | | | | | | | |
| Compound B | | | 5 | | | | | |
| Compound C | | | | | | | | |

TABLE 5-continued

|  | 1 | 2 | 3 | 4 | 5 | 6 | 7 | 8 |
|---|---|---|---|---|---|---|---|---|
| Compound D |  |  |  |  |  |  |  |  |
| Compound E |  |  |  |  |  |  |  |  |
| Compound F | 10 |  |  |  |  |  |  |  |
| Compound G |  | 5 |  |  |  |  |  |  |
| Compound H |  |  | 5 |  |  |  |  |  |
| Compound I |  |  |  | 20 |  |  |  |  |
| Compound J |  |  |  |  | 5 |  |  |  |
| Compound K |  |  |  |  |  |  | 25 |  |
| Compound L |  |  |  |  |  |  |  | 10 |
| Formic acid |  |  |  |  |  |  |  |  |
| Acetic acid |  |  |  |  |  |  |  |  |
| Metal salt |  |  |  |  |  |  |  |  |
| Copper acetate |  |  | 0.2 |  |  |  |  |  |
| Cuprous chloride |  | 0.06 |  |  |  |  |  |  |
| Cuprous bromide |  |  |  | 0.07 |  |  |  |  |
| Cupric chloride |  |  |  |  | 0.15 |  |  | 0.15 |
| Cupric bromide |  |  | 0.08 |  |  |  | 0.15 |  |
| Zinc acetate |  |  |  |  |  | 0.10 |  | 0.20 |
| Zinc chloride |  | 1.5 | 1.00 |  |  |  |  |  |
| Halogen |  |  |  |  |  |  |  |  |
| Ammonium chloride |  |  |  |  |  |  |  |  |
| Potassium chloride |  |  |  |  |  |  |  |  |
| Ammonium bromide |  |  |  |  |  |  |  |  |
| Potassium bromide |  |  | 0.18 |  | 0.09 |  |  |  |
| Ammonium iodide |  |  |  |  |  |  | 0.07 |  |
| Potassium iodide |  |  |  |  |  |  |  | 0.08 |
| Copper iodide |  | 0.09 |  |  |  | 0.09 |  |  |
| pH | 3.1 | 2.7 | 2.8 | 3.6 | 2.7 | 4.3 | 2.7 | 2.6 |
| Treatment conditions |  |  |  |  |  |  |  |  |
| Treatment temperature (° C.) | 50 | 40 | 50 | 50 | 40 | 50 | 30 | 50 |
| Treatment time (sec) | 120 | 30 | 60 | 60 | 90 | 180 | 120 | 60 |
| Evaluation test |  |  |  |  |  |  |  |  |
| Solder flow-up rate properties (%) Tin-lead based eutectic solder (240° C.) | 74 | 68 | 60 | 37 | 100 | 20 | 100 | 100 |
| Solder flow-up rate properties (%) Lead-free solder (245° C.) | 50 | 55 | 52 | 20 | 100 | 17 | 100 | 100 |
| Solder spreadability (mm) Tin-lead based eutectic solder (240° C.) | 2.31 | 2.44 | 2.36 | 2.11 | 3.79 | 2.10 | 3.85 | 3.77 |
| Solder spreadability (mm) Lead-free solder (245° C.) | 1.51 | 1.50 | 1.50 | 1.40 | 1.66 | 1.42 | 1.65 | 1.72 |

Comparative Examples 1 to 11

Each water-soluble preflux having a composition as described in Table 6 was prepared in the same manner as in Example 1 and subjected to a surface treatment under treating conditions as described in Table 6. Then, the evaluation tests were performed. The obtained test results are shown in Table 6.

TABLE 6

| | Comparative Example |||||||||||
|---|---|---|---|---|---|---|---|---|---|---|---|
| | 1 | 2 | 3 | 4 | 5 | 6 | 7 | 8 | 9 | 10 | 11 |
| Composition of surface treating agent (% by weight) |||||||||||
| Imidazole |  |  |  |  |  |  |  |  |  |  |  |
| 2-Undecylimidazole | 0.5 |  |  |  |  |  |  |  |  |  |  |
| 2-Phenylimidazole |  | 0.5 |  |  |  |  |  |  |  |  |  |
| 2-Phenyl-4-methylimidazole |  |  | 0.5 |  |  |  |  |  |  |  |  |
| 2-Phenyl-4-(3,4-dichlorophenyl)imidazole |  |  |  | 0.25 |  |  |  |  |  |  |  |
| 2-Phenyl-4-(2-naphthyl)-5-methylimidazole |  |  |  |  | 0.25 |  |  |  |  |  |  |
| 2-Phenyl-4-(2-naphthyl)imidazole |  |  |  |  |  | 0.25 |  |  |  |  |  |
| 2-Benzyl-4-methylimidazole |  |  |  |  |  |  | 0.25 |  |  |  |  |
| 2-Nonylbenzimidazole |  |  |  |  |  |  |  | 0.25 | 0.25 |  |  |
| 2-(4-Chlorophenyl)methylbenzimidazole |  |  |  |  |  |  |  |  |  | 0.25 |  |
| 2-(1-Naphthyl)methylbenzimidazole |  |  |  |  |  |  |  |  |  |  | 0.20 |
| Solubilizing agent |  |  |  |  |  |  |  |  |  |  |  |
| Compound A |  |  |  |  |  |  |  |  |  |  |  |
| Compound B |  |  |  |  |  |  |  |  |  |  |  |

TABLE 6-continued

| | Comparative Example | | | | | | | | | | |
|---|---|---|---|---|---|---|---|---|---|---|---|
| | 1 | 2 | 3 | 4 | 5 | 6 | 7 | 8 | 9 | 10 | 11 |
| Composition of surface treating agent (% by weight) | | | | | | | | | | | |
| Compound C | | | | | | | | | | | |
| Compound D | | | | | | | | | | | |
| Compound E | | | | | | | | | | | |
| Compound F | | | | | | | | | | | |
| Compound G | | | | | | | | | | | |
| Compound H | | | | | | | | | | | |
| Compound I | | | | | | | | | | | |
| Compound J | | | | | | | | | | | |
| Compound K | | | | | | | | | | | |
| Compound L | | | | | | | | | | | |
| Formic acid | 3 | | | 40 | | | | | | 5 | |
| Acetic acid | | 10 | 10 | | 30 | 30 | 10 | 15 | 15 | | 10 |
| Metal salt | | | | | | | | | | | |
| Copper acetate | 0.03 | | | | | | | | | | 0.02 |
| Cuprous chloride | | | | | | | | | | 0.06 | |
| Cuprous bromide | | | 0.07 | | | | | | | | |
| Cupric chloride | | | | 0.15 | | 0.15 | | | | | |
| Cupric bromide | | | | | 0.15 | | | 0.15 | | | 0.08 |
| Zinc acetate | | | | | | 0.20 | 1.00 | | | | |
| Zinc chloride | | | | | | | | 0.10 | | 1.5 | 1.00 |
| Halogen | | | | | | | | | | | |
| Ammonium chloride | 0.10 | | | | | | | | | | |
| Potassium chloride | | | | | | | | 0.30 | | | |
| Ammonium bromide | | | 0.08 | | | | | 0.08 | | | |
| Potassium bromide | | | | 0.09 | | | | | | | 0.18 |
| Ammonium iodide | | | | | 0.07 | | | | | | |
| Potassium iodide | | | | | | 0.08 | | | | | |
| Copper iodide | | | | | | | 0.09 | | | 0.09 | |
| pH | 4.4 | 4.5 | 4.7 | 2.2 | 3.4 | 3.1 | 3.1 | 3.4 | 3.5 | 2.4 | 3.2 |
| Treatment conditions | | | | | | | | | | | |
| Treatment temperature (° C.) | 40 | 50 | 50 | 40 | 30 | 50 | 50 | 30 | 50 | 40 | 50 |
| Treatment time (sec) | 30 | 300 | 180 | 180 | 300 | 60 | 300 | 30 | 60 | 90 | 30 |
| Evaluation test | | | | | | | | | | | |
| Solder flow-up rate properties (%) Tin-lead based eutectic solder (240° C.) | 23 | 32 | 28 | 100 | 100 | 100 | 20 | 76 | 72 | 66 | 64 |
| Lead-free solder (245° C.) | 15 | 15 | 14 | 98 | 95 | 96 | 12 | 58 | 47 | 52 | 60 |
| Solder spreadability (mm) Tin-lead based eutectic solder (240° C.) | 1.90 | 2.22 | 2.11 | 3.72 | 3.61 | 3.58 | 2.01 | 2.35 | 2.25 | 2.32 | 2.40 |
| Lead-free solder (245° C.) | 1.35 | 1.37 | 1.42 | 1.62 | 1.62 | 1.61 | 1.42 | 1.48 | 1.47 | 1.51 | 1.52 |

According to the test results as shown in Table 5 and Table 6, it is recognized that in the case where the surface treatment was performed using the water-soluble preflux containing each of Compounds A to L as a solubilizing agent and then soldering was performed using an eutectic solder or a lead-free solder, the solder flow-up rate properties and solder spreadability are greatly improved as compared with the case of using formic acid or acetic acid as a solubilizing agent, regardless of the kind of imidazole compounds.

Incidentally, the water-soluble prefluxes prepared in Examples had no odor but the water-soluble prefluxes of Comparative Examples had characteristic irritating odor caused by evaporation of acetic acid or formic acid.

While the invention has been described in detail and with reference to specific embodiments thereof, it will be apparent to one skilled in the art that various changes and modifications can be made therein without departing from the intention and scope thereof.

The present application is based on Japanese Patent Application No. 2005-150279 filed on May 24, 2005 and Japanese Patent Application No. 2005-355985 filed on Dec. 9, 2005, and the contents are incorporated herein by reference.

INDUSTRIAL APPLICABILITY

Since the water-soluble preflux of the invention contains a low-volatile carboxylic acid compound as a solubilizing agent for imidazole compounds, it is possible to stably maintain the concentration of the solubilizing agent in the water-soluble preflux and no bad odor is generated. Moreover, as compared with the case where formic acid or acetic acid is used as a solubilizing agent, an excellent film-forming property of the imidazole compound can be brought out.

According to the surface treatment method of the invention, a chemical layer can be formed on the surface of a metal conductive part and hence oxidation of the surface of the metal conductive part can be prevented.

When the printed wiring board of the invention is used, the bonding between the metal conductive part and electronic parts can be securely performed by soldering.

According to the soldering method of the invention, oxidation of the surface of the metal conductive part can be prevented and hence the solderability can be made good.

The invention claimed is:

1. A water-soluble preflux comprising 0.01 to 10% by weight of an imidazole compound and 0.1 to 50% by weight of a carboxylic acid compound having 4 to 16 carbon atoms represented by the following formula 1:

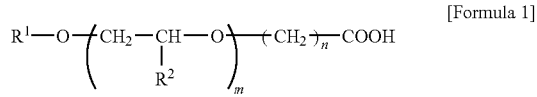

[Formula 1]

wherein $R^1$ represents a linear or branched alkyl group having 1 to 4 carbon atoms, $R^2$ represents a hydrogen atom or a methyl group, m represents an integer of 0 to 3, and n represents 1 or 2.

2. A surface treatment method for a metal conductive part, which comprises bringing the surface of the metal conductive part into contact with the water-soluble preflux according to claim 1.

3. A printed wiring board, wherein the surface of a metal conductive part has been brought into contact with the water-soluble preflux according to claim 1.

4. A soldering method, which comprises bringing the surface of a metal conductive part into contact with the water-soluble preflux according to claim 1 and then performing soldering.

* * * * *